United States Patent [19]

Grant et al.

[11] 3,813,560

[45] May 28, 1974

[54] CURRENT MODE SWITCH FOR HIGH SPEED DIGITAL-TO-ANALOG CONVERSION

[75] Inventors: Jon Halloran Grant, Diamond Bar; Raymond W. Pauly, Newport Beach, both of Calif.

[73] Assignee: Hughes Aircraft Company, Culver City, Calif.

[22] Filed: Apr. 30, 1970

[21] Appl. No.: 43,614

[52] U.S. Cl. .................. 307/253, 307/254, 307/242, 307/259, 340/347 DA

[51] Int. Cl. ....................... H03k 17/60, H03k 13/02

[58] Field of Search ...... 340/347 DA; 307/242, 248, 307/254, 259, 253

[56] References Cited

UNITED STATES PATENTS

| | | | |
|---|---|---|---|
| 3,474,440 | 10/1969 | Schmid | 340/347 |
| 3,544,994 | 12/1970 | Hanson et al. | 307/242 X |
| 3,573,489 | 4/1971 | Sramek | 307/254 X |

*Primary Examiner*—Richard A. Farley
*Assistant Examiner*—H. A. Birmiel
*Attorney, Agent, or Firm*—James K. Haskell; Walter J. Adam

[57] ABSTRACT

A current mode switch for high speed digital-to-analog conversion using first and second transistors with matched $V_{BE}$ characteristics. A first resistor between a power source and the emitter of the first transistor provides current to be switched from an input control diode to a summing junction through a second resistor connected between the emitters of the two transistors. The difference between reference voltages on the bases of the transistors determines the level of current through the second resistor, and the high impedance of the second resistor in series with the second transistor reduces the level of noise and switching transient energy coupled to the summing junction. For applications not requiring accuracy, a diode may be substituted for the first transistor and the second transistor may be common to other current switches.

10 Claims, 2 Drawing Figures

INVENTORS.
JON H. GRANT,
RAYMOND W. PAULY,
BY
J K Haskell
ATTORNEY.

CURRENT MODE SWITCH FOR HIGH SPEED DIGITAL-TO-ANALOG CONVERSION

The invention herein described was made in the course of or under a Contract or Subcontract thereunder with the Navy.

BACKGROUND OF THE INVENTION

This invention relates to a digital-to-analog converter and, more particularly, to a current mode switch for high speed digital-to-analog converters.

In the past, resistor ladder networks have been employed with voltage switches to convert digital signals representing binary numbers into a proportional analog voltage. Such networks are not satisfactory for high speed digital-to-analog conversion since, for a first approximation, a given ladder network may be thought of as a distributed R-L-C line with N different taps along its length, where N is the number of digits in the binary number being converted, and each tap is connected to a unique voltage switch by a separate resistor. As the switches are activated in different patterns in response to different binary numbers being converted, the ladder network will function with different settling times (i.e., R-C time constants). In addition, the network may operate with a number of different modes of resonance. In other words, upon actuating a particular voltage switch, a step voltage change across its connecting resistor will require a long time to charge distributed capacitance and may tend to resonate, depending upon the terminations of other resistor branches and the length of completed external electrical paths through closed switches.

Since all resistor ladder sections may be considered in the first approximation as line sections with branches to voltage switches, and such sections and branches are high impedance, the settling time for resonance will be long (i.e., the R-C time constants will be large). This will generally limit use of a resistor ladder network to applications requiring slow digital-to-analog conversions. For many applications, as in a high speed cathode ray tube display system, it is essential to minimize the settling time.

Current switching techniques for digital-to-analog conversion have been developed with more satisfactory high speed performance because each circuit for switching a binary weighted current may be connected directly to a summing junction. However, a noise problem may exist due to capacitance across current diverting switches controlled by the digital input since such capacitance will couple switching transients and noise in the digital input circuit directly into the summing junction. Another problem is that since the current through a weighted resistor is being switched from a reference voltage source, the reference voltage source must be a high current and low impedance source. It would be desirable to alleviate these problems with current switching circuits which draw very little current from the voltage reference source, and which are effective in shunting switching transients and noise introduced by the digital input circuit.

SUMMARY OF THE INVENTION

A current switch for a digital-to-analog converter is provided in accordance with the present invention by utilizing two junction transistors of like conductivity type with matched base-emitter voltage ($V_{BE}$) characteristics. The emitter of one transistor is connected to a source of power supply through a first resistor and to the emitter of the other transistor through a second resistor. The collector of the first transistor is connected to a source of reference potential and the collector of the second transistor is connected to a summing junction. The base electrodes of the first and second transistors are connected to sources of first and second reference voltages selected such that the difference between the reference voltages provides an output current to the summing junction equal to that voltage difference divided by the resistance of the second resistor, less the small base current of the second transistor. A diode is connected between a digital input terminal and the emitter of the first transistor and poled to be forward biased when the digital input signal is at a level representing a binary-0, and back biased when the input signal is at a level representing a binary-1. Thus, when the digital input is a binary-0, the base-emitter junction of the second transistor is back biased and the output current is 0. When the digital input is a binary-1, the output current is as determined by the second resistor. The resistance of the first resistor is selected such that the current through the two transistors will be equal while both are conducting. All noise and transient switching energy is isolated from the summing junction by the resistance of the second resistor and the second transistor in series, thereby reducing the energy transmitted to the output. In applications requiring only speed and noise immunity, and not accuracy, the base-emitter junction of the first transistor may be replaced by a junction diode and the second transistor may be common to other current switches. A common-base preamplifier may be employed to isolate capacitances of the switches connected to the summing junction from an operational amplifier.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
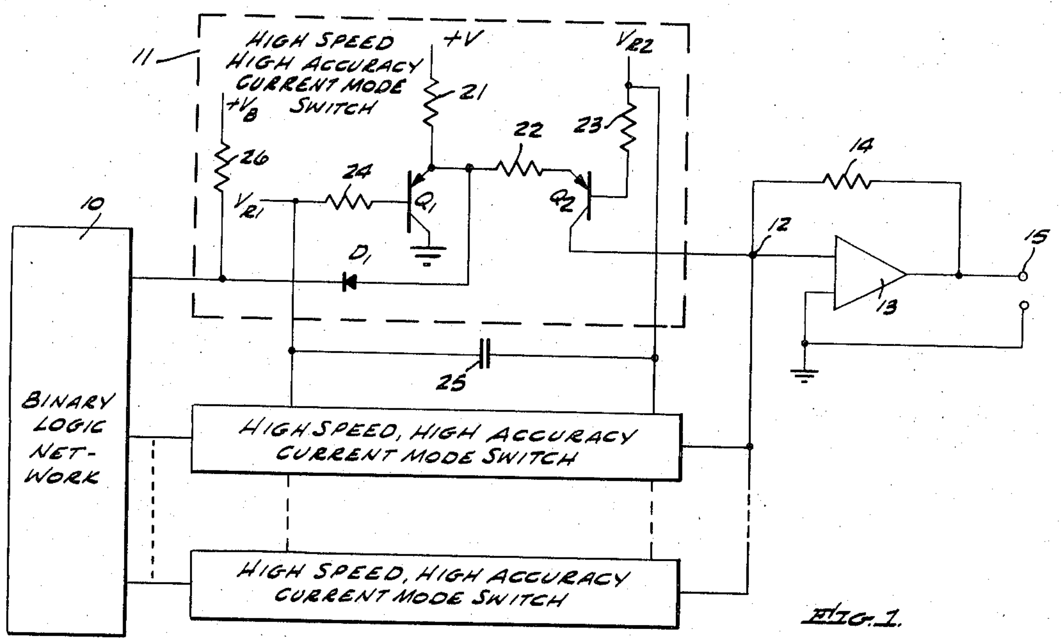
FIG. 1 illustrates a schematic diagram of a current switching circuit in a digital-to-analog converter.

Referring now to FIG. 1, normal current switches controlled by a digital logic network 10, such as a current switch 11, have their current output terminals connected to a summing junction 12 that is coupled to an inverting operational amplifier 13 having a feedback resistor 14. The operational amplifier provides an output voltage signal proportional to the sum of the input currents to the summing junction 12.

In practice, each of the current switches may provide an output current to the summing junction 12 which is weighted by the binary value of the digital signal at its input terminal from the binary logic network 10 to convert a binary number represented by weighted digital signals into an output signal at a terminal 15 having an amplitude proportional to the sum of the binary weighted digital input signals. Alternatively, each current switch may provide an output current to the junction 12 of a predetermined amplitude, in which case digital input signals are provided by the binary logic network of equal weight in response to a binary number. For example, if fifteen current switches connected to the summing junction 12 provide equal (monobit) output currents, a binary logic network 10 is provided that will decode a 4-bit binary number to turn on a number of current switches from 0 to 15, according to the value of the binary number. Whether or not weighted currents are to be employed will depend largely upon the application or environment of the invention.

The advantage of using the weighted-current technique is obviously that only N current switches are required to convert a N-bit number into an analog signal instead of 2N. However, if controlling parameters of all current switches are the same to provide the same output current to the summing junction 12, then modular construction using integrated circuits is greatly facilitated. Another advantage of using that monobit technique is that tolerances on the controlling parameters are the same for all current switches, whereas in current switches producing binary weighted output currents, tolerances will decrease for each successive order in proportion to the increased weight of output current.

A combination of the two techniques is optimum for accuracy in each bit position without burdensome tolerances and excessive complexity. For example, to convert a 10-bit number, the least significant six bits may be converted using the weighted-current technique. The tolerances for the most significant one of those six bits would then be only one part in $2^6$, which is only slightly less than 1 percent. The remaining four bits could then be converted by fifteen switches using the monobit technique. To combine the currents using the two techniques in a hybrid arrangement, it is then only necessary to scale the currents from the least significant bits through voltage dividers coupling those current signals to a summing junction.

Regardless of the technique employed, the circuit of each current switch is the same in configuration and operation. Accordingly, only the circuit of the current switch 11 is shown. All other switches are identical if output currents are of equal weight, and are the same in configuration but with different parameters to be noted hereinafter if the output currents are to be weighted.

The current switch 11 comprises transistors $Q_1$ and $Q_2$ of the same conductivity type which matched base-emitter voltage ($V_{BE}$) characteristics. As shown, both transistors are of the PNP type and are preferably provided as dual transistors on a common integrated circuit substrate, but may be provided as individual matched transistors, and may be provided as NPN type transistors by simply reversing the polarities of voltages shown. The emitter of the first transistor $Q_1$ is connected to a source of power supply +V through a first resistor 21 and to the emitter of the second transistor $Q_2$ through a second resistor 22. The collector of the first transistor is connected to a source of reference potential (circuit ground) and the collector of the second transistor is connected to the summing junction 12.

The base electrodes of the transistors $Q_1$ and $Q_2$ are connected to respective first and second reference voltages $+V_{R1}$ and $+V_{R2}$ so selected that the difference $(V_{R1}-V_{R2})$ provides an output current to the summing junction 12 equal to the difference $(V_{R1}-V_{R2})$ divided by R, where R is the resistance of the resistor 22, less the small base current through the base-emitter junction of the transistor $Q_2$.

The resistance of the resistor 21 is selected to provide equal currents through the transistors $Q_1$ and $Q_2$ when an output current to the junction 12 is produced in response to a high (binary-1) input signal that back biases a diode $D_1$. The binary-1 input signal is selected to be above $V_{R1}+V_{BE}-V_c$, where $V_{BE}$ is the base-emitter voltage drop in the transistor $Q_1$ and $V_c$ is the forward conduction voltage drop across the diode $D_1$. That is typically +5 volts.

If the transistors $Q_1$ and $Q_2$ are selected to have high $\beta$, the output current to the junction 12 will be very nearly equal to the voltage difference $(V_{R1}-V_{R2})$ divided by R since a high $\beta$ will assure a very low base current in the transistor $Q_2$. Resistors 23 and 24 connect the voltage references $V_{R1}$ and $V_{R2}$ to the bases of transistors $Q_1$ and $Q_2$, respectively to prevent emitter-follower-type oscillation. In practice, the resistances of the resistors 23 and 24 are very small, on the order of 100 ohms ±25 percent.

A capacitor 25 is connected between the voltage references $V_{R1}$ and $V_{R2}$ common to all switches to filter noise and switching transients which may occur in the source of either reference voltage and which would otherwise appear in the difference $(V_{R1}-V_{R2})$.

When the digital input signal is low (binary-0), the diode $D_1$ is forward biased thereby clamping the emitter of the transistor $Q_1$ to a low level, at which time the base-emitter junction of the transistor $Q_2$ is back biased to reduce the output current to zero. To accomplish that, the binary-0 level must be below $V_{R2}+V_{BE}-V_c$, where $V_{BE}$ is the base-emitter voltage drop in the transistor $Q_2$ and $V_c$ is the voltage drop across the diode $D_1$. That voltage level is typically zero, or very nearly circuit ground potential.

The low level at which the digital input signal will back bias the base-emitter junction of the transistor $Q_2$ is $V_{R2}$ plus the base-emitter voltage $V_{BE}$ of the transistor $Q_2$ less the voltage drop across the diode $D_1$, and the high level of the input signal which back biases the diode $D_1$ and forward biases the base-emitter junction of the transistor $Q_2$ is $V_{R1}$ plus the base-emitter voltage $V_{BE}$ of the first transistor $Q_1$ less the voltage drop across the diode $D_1$. A pull-up resistor 26 is connected between the cathode of the diode $D_1$ and a source of bias voltage $+V_B$ to speed switching current to the summing junction 12 in response to a binary-1 input signal.

In operation, with the logic input high (binary-1), noise introduced across the capacitance of the diode $D_1$ is coupled into the low base-emitter impedance of the transistor $Q_1$ and shunted to circuit ground because the resistor 22 presents a high impedance between the diode $D_1$ and the summing junction 12. That greatly reduces noise in the output signal. With the logic input low (binary-0), noise introduced across the capacitance of the diode $D_1$ is not coupled to the summing junction because the transistor $Q_2$ is then biased to cut-off.

When the transistor $Q_2$ is conducting, its impedance is low but the remaining impedance of the resistor 22 may be relatively high, typically 3 kohms. Accordingly, the present invention provides a nearly ideal current switch in regard to eliminating noise and switching transient energy from the summing junction. In addition, there is very little loading of the reference voltages $V_{R1}$ and $V_{R2}$ since output current is being provided by the power supply through the resistor 21 and the transistor $Q_2$, with very little base current through the transistors $Q_1$ and $Q_2$. Since the output current from the supply +V is switched from the transistor $Q_2$ to the diode $D_1$ when the input signal goes from a high level to a low level, and from the diode $D_1$ to the transistor $Q_2$ when the input signal goes from a low level to a high level, the advantage of high speed current switching is achieved without coupling noise and switching transient energy to the summing junction.

As noted hereinbefore, all of the current switches may produce output currents of equal amplitude, but for a direct binary digital-to-analog conversion, the currents transmitted to the summing junction 12 by the respective current switches connected to different orders of binary digital input signals are weighted in accordance with the weights of the controlling binary signals. That may be readily accomplished by proper selection of the resistor 22 and the reference voltages $V_{R1}$ and $V_{R2}$.

It should be understood that a non-inverting operational amplifier may be desired, or required, in place of the inverting operational amplifier 13, depending upon the environment of the present invention, and that other amplifier configurations may be employed having low input impedance. In applications requiring a large number of switches, the capacitances of the switches connected to the summing junction 12 may be isolated from the operational amplifier 14 by the low base-emitter impedance of a transistor connected in a common-base configuration. For example, in the 10-bit hybrid converter suggested hereinbefore, the fifteen monobit switches may be connected to a summing junction coupled to an operational amplifier. The voltage-dividing (scaling) networks for the current-weighted switches are then connected directly to the operational amplifier. That simplifies the design necessary for the amplifier, which is preferably designed as a filtering (smoothing) amplifier to eliminate the output transients which might otherwise occur due to the various current switches not turning on and off precisely in synchronism.

Figure 2:
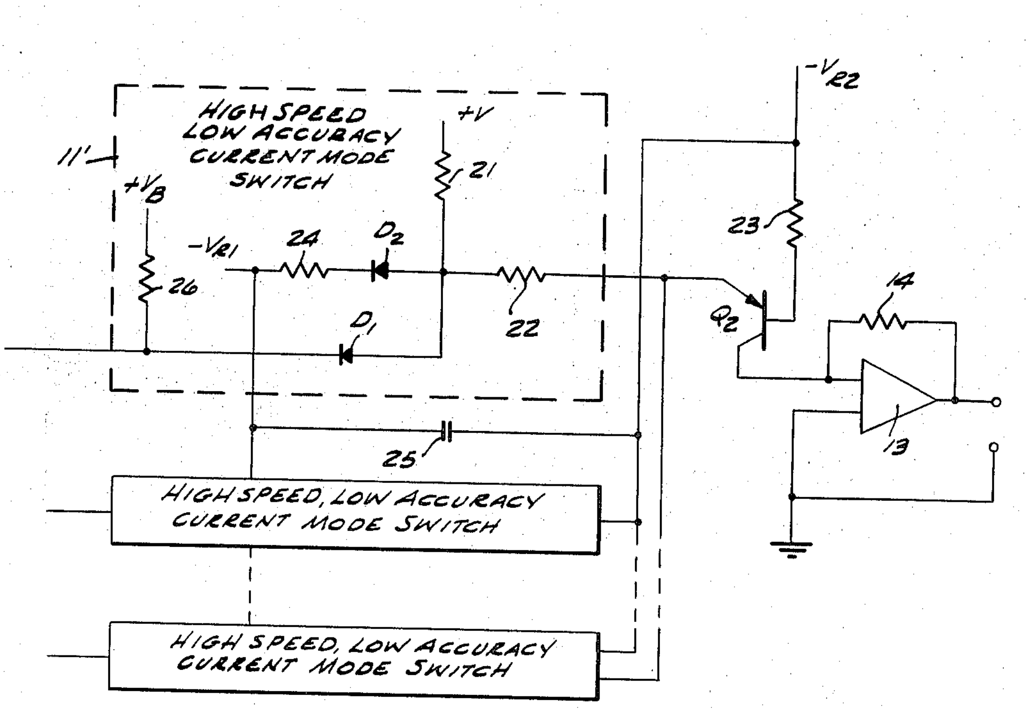
FIG. 2 illustrates a variation of the present invention for applications not requiring accuracy.

In applications requiring only speed and noise immunity but not absolute accuracy, a diode may be substituted in place of the base-emitter junction of the transistor $Q_1$ and the transistor $Q_2$ may be a transistor common to all switches, thereby moving the summing junction 12 from the collector of each transistor in the preferred embodiment to the emitter of one transistor. That is illustrated in FIG. 2 showing a circuit diagram of a switch 11' wherein like reference numerals refer to like components to facilitate comparison with FIG. 1, and diode $D_2$ has replaced the transistor $Q_1$ of FIG. 1. The degradation of accuracy would be about 5 percent, but the arrangement is less expensive and still has the same advantage of switching current between a diode unique to a given switch and a transistor common to all switches.

Although particular embodiments of the invention have been described, and a preferred embodiment illustrated herein, it is recognized that modifications and variations may readily occur to those skilled in the art. Consequently, it is intended that the claims be interpreted to cover such modifications and equivalents.

What is claimed is:

1. A current mode switch comprising:
a first diode of the junction type;
a source of power supply;
a first resistor connecting one terminal of said diode to said source of power supply;
means for applying a first reference voltage at a given potential to the terminal of said first diode opposite said one terminal to forward bias said first diode;
a junction transistor having a base, collector and emitter, said collector being adapted to be connected to an output circuit;
a resistor connecting the emitter of said transistor to said one terminal of said diode;
means for applying a second reference voltage to the base of said transistor to forward bias the base-emitter junction thereof, where said second reference voltage is selected relative to said first reference voltage to conduct current from said source of power supply and through the emitter and collector of said transistor to provide the desired current level to said output circuit; and
a second diode having one terminal connected to the one terminal of said first diode and the other terminal adapted to receive an input signal from a control circuit, said second diode being poled for conduction from said source of power supply when forward biased by said input signal, thereby back biasing the base-emitter junction of said transistor to inhibit current from passing from said source of power supply to said output circuit.

2. A current mode switch as defined in claim 1 wherein said resistor connected between said power supply and said first diode is selected to provide equal currents through said first diode and said transistor when said second diode is back biased.

3. A current mode switch as defined in claim 2 wherein said output circuit is a current summing circuit having a summing junction for receiving currents from a plurality of current switches, and said control circuit provides separate digital control signals to each for digital-to-analog conversion.

4. A current mode switch as defined in claim 3 wherein said transistor is common to said plurality of current switches.

5. A current mode switch as defined in claim 1 wherein said first diode is a base-emitter junction of a second transistor having a collector connected to circuit ground.

6. A current mode switch comprising:
first and second junction transistors of like conductivity type, each having a base, an emitter and a collector, the collector of said first transistor being connected to a source of first reference voltage and the collector of said second transistor being adapted to be connected to an output circuit;
a source of power supply;
a resistor connecting the emitter of said first transistor to said source of power supply;
means for applying a second reference voltage to the base of said first transistor at a given potential to forward bias the base-emitter junction of said first transistor;
a resistor connecting the emitter of said first transistor to the emitter of said second transistor;
means for applying a third reference voltage to the base of said second transistor at a given potential to forward bias the base-emitter junction of said first transistor where said third reference voltage is selected relative to said second reference voltage to conduct current from said source of power and through the emitter and collector of said second transistor to provide the desired current level to said output circuit; and a diode having one terminal connected to the emitter of said first transistor and the other terminal adapted to receive an input signal from a control circuit, said diode being poled for conduction when forward biased by said input signal, thereby back biasing the base-emitter junction of said second transistor to inhibit current from passing to said output circuit.

7. A current mode switch as defined in claim 6 wherein said transistors are matched for their base-emitter voltage characteristics.

8. A current mode switch as defined in claim 7 wherein said resistor connected between said power supply and said first transistor is selected to provide equal currents through said second and third transistors when said diode is back biased.

9. A current mode switch as defined in claim 8 wherein said second and third reference voltages are of the same polarity as said power supply.

10. A current mode switch as defined in claim 9 wherein said output circuit is a current summing circuit having a summing junction adapted to be connected to a plurality of other similar current mode switches, and said control circuit provides separate digital control signals to each for digital-to-analog conversion.

* * * * *